United States Patent
Van Cannon et al.

(10) Patent No.: US 7,719,355 B2
(45) Date of Patent: May 18, 2010

(54) METHOD AND APPARATUS FOR PROVIDING A CARTESIAN TRAINING WAVEFORM

(75) Inventors: Billy J. Van Cannon, Morton Grove, IL (US); Apolinar Chaidez, South Elgin, IL (US); Theodore M. Lietz, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 523 days.

(21) Appl. No.: 11/755,816

(22) Filed: May 31, 2007

(65) Prior Publication Data
US 2008/0299922 A1  Dec. 4, 2008

(51) Int. Cl.
*H03F 1/26* (2006.01)
(52) U.S. Cl. .................. 330/149; 330/107
(58) Field of Classification Search .......... 330/149, 330/107
See application file for complete search history.

(56) References Cited

U.S. PATENT DOCUMENTS

| | | | |
|---|---|---|---|
| 5,066,923 A | 11/1991 | Gailus | |
| 5,134,718 A | 7/1992 | Gailus | |
| 5,420,536 A | 5/1995 | Faulkner | |
| 5,559,468 A | 9/1996 | Gailus | |
| 5,623,226 A * | 4/1997 | Whitmarsh et al. | 330/2 |
| 5,638,024 A | 6/1997 | Dent | |
| 5,694,433 A | 12/1997 | Dent | |
| 5,722,056 A * | 2/1998 | Horowitz et al. | 455/126 |
| 5,990,734 A * | 11/1999 | Wright et al. | 330/2 |
| 6,897,723 B2 | 5/2005 | Gentzler | |
| 7,353,005 B2 * | 4/2008 | Ben-Ayun et al. | 455/115.2 |

* cited by examiner

*Primary Examiner*—Patricia Nguyen
(74) *Attorney, Agent, or Firm*—Valerie M. Davis

(57) ABSTRACT

One provides (401, 402) both an in-phase signal component (501) and a quadrature signal component (601) wherein the latter has a non-zero portion. These two signal components are then combined (403) to provide a Cartesian training waveform that can be used when training a linear amplifier that uses Cartesian feedback linearization. By one approach, the non-zero portion of the quadrature signal component can be coincident with a zero-crossing portion of the in-phase signal. In many application settings this non-zero portion of the quadrature signal component can be less (and sometimes considerably less) than a peak amplitude of the in-phase signal component. One may also shape the in-phase signal component to have a smoothed envelope. This may include, for example, using a smoothed sine wave such as a raised-sine function.

15 Claims, 2 Drawing Sheets

METHOD AND APPARATUS FOR PROVIDING A CARTESIAN TRAINING WAVEFORM

TECHNICAL FIELD

This invention relates generally to linear amplifiers and more particularly to Cartesian feedback-based linearization.

BACKGROUND

Generally speaking, a linear amplifier provides an output that is linearly proportional to its input. Such a performance characteristic is important in many application settings such as, but not limited to, wireless transmissions. Unfortunately, many cost effective amplifier designs only exhibit substantially linear behavior over a portion of a corresponding operating range.

Various techniques are therefore known in the art to facilitate linearizing the performance of such an amplifier. One such technique can be referred to as Cartesian feedback linearization and provides, in part, for closed loop phase training of the amplifier. This training utilizes a Cartesian training waveform of known form and duration (which may comprise, at least in part, a sine wave).

Such an approach, unfortunately, can give rise to a certain amount of corresponding adjacent channel splatter during the phase training activity. This unwanted phenomena is becoming a source of greater concern as standards and specifications governing levels of acceptable splatter become ever more restrictive.

BRIEF DESCRIPTION OF THE DRAWINGS

The accompanying figures, where like reference numerals refer to identical or functionally similar elements throughout the separate views, which together with the detailed description below are incorporated in and form part of the specification and serve to further illustrate various embodiments of concepts that include the claimed invention, and to explain various principles and advantages of those embodiments. Moreover, the above needs are at least partially met through provision of the method and apparatus for providing a Cartesian training waveform described in the following detailed description, particularly when studied in conjunction with the drawings, wherein:

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Generally speaking, pursuant to these various embodiments, one provides both an in-phase signal component and a quadrature signal component wherein the latter, contrary to prior art practice in this regard, has a non-zero portion. These two signal components are then combined to provide a Cartesian training waveform that can be used when training a linear amplifier that uses Cartesian feedback linearization. By one approach, the non-zero portion of the quadrature signal component can be coincident with a zero-crossing portion of the in-phase signal. In many application settings this non-zero portion of the quadrature signal component can be less (and sometimes considerably less) than a peak amplitude of the in-phase signal component. So configured, the resultant Cartesian training waveform does not cross the corresponding constellation origin. This, in turn, avoids an abrupt phase change that would otherwise instigate objectionable noise across adjacent channels.

Depending upon the needs and/or requirements of the application setting, one may also shape the in-phase signal component to have a smoothed envelope. This may comprise, for example, using a smoothed sine wave such as a raised-sine function, thereby further reducing the training waveform adjacent channel noise.

These teachings are readily implemented in an economical and effective manner. Those skilled in the art will also appreciate that these teachings can be implemented with existing linear amplifiers that use Cartesian linearization without modification.

Figure 1:
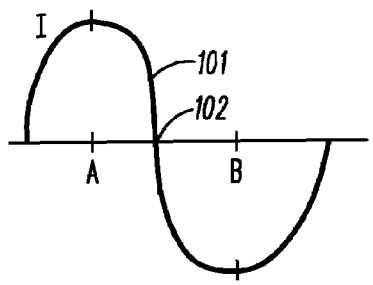
FIG. 1 comprises a signal waveform diagram as configured in accordance with the prior art.

These and other benefits may become clearer upon making a thorough review and study of the following detailed description. Referring now to the drawings, and in particular to FIG. 1, it may be helpful to first briefly describe in additional detail certain prior art practices that exemplify at least one problem that is insufficiently addressed by past efforts. In FIG. 1, a Cartesian training waveform can be seen to comprise an in-phase signal component 101 that itself comprises, in this example, a sine wave. This in-phase signal component 101 has a zero-crossing 102 as is well understood in the art.

Figure 2:
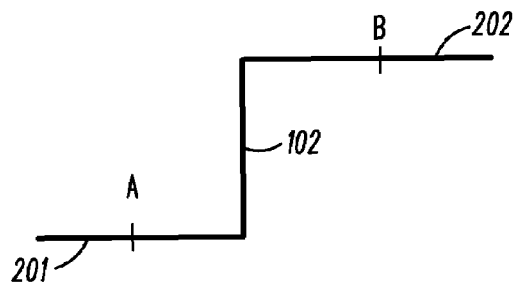
FIG. 2 comprises a phase diagram as configured in accordance with the prior art.
Figure 3:
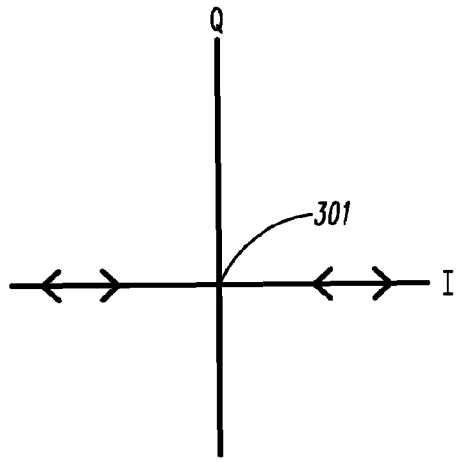
FIG. 3 comprises a constellation diagram as configured in accordance the prior art.

Referring now to FIG. 2, a phase diagram as pertains to this same Cartesian training waveform exhibits a sharp, abrupt phase transition from a first phase state 201 to a second phase state 202 at the aforementioned zero-crossing 102. (A constellation diagram presented in FIG. 3 further illustrates that this in-phase signal component travels directly through an origin point 301 for the in-phase/quadrature content of this waveform.) It is this abrupt phase transition, coupled with the illustrated traversal of the constellation origin 301, which gives rise to the adjacent channel splatter of concern.

Figure 4:
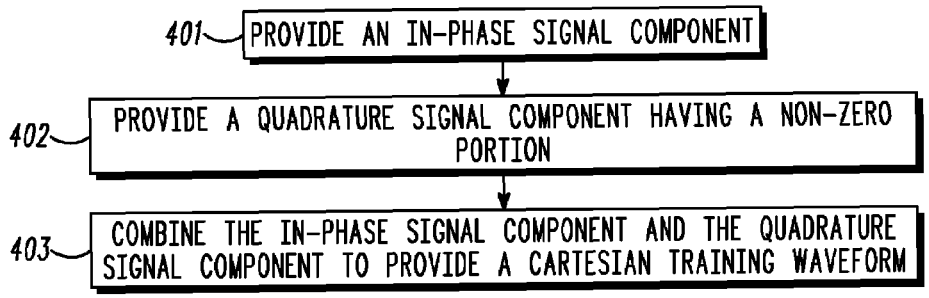
FIG. 4 comprises a flow diagram as configured in accordance with various embodiments.

To meet such deficiencies of the prior art, and referring now to FIG. 4, these teachings provide for a process 400 that provides 401 for an in-phase signal component. This in-phase signal component typically has a zero-crossing portion but otherwise largely comprises non-zero portions. By one approach, this in-phase signal component can comprise a sine wave.

Figure 5:
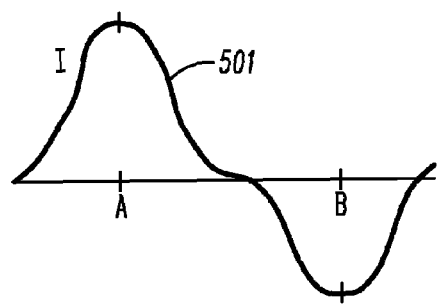
FIG. 5 comprises a signal diagram as configured in accordance with various embodiments.

In many cases, this training waveform comprises only one cycle of the corresponding signal. Being non-continuous, of course, can serve to effectively introduce frequency content beyond that represented by the periodicity of the waveform itself, even when that waveform comprises a true sine wave. This, in turn, can lead to adjacent channel splatter. If desired, however, this in-phase component can comprise a smoothed sine wave such as a raised-sine function. FIG. 5 presents an illustrative depiction of one example of an in-phase signal component 501 that comprises a smoothed sine wave. In general, such a smoothed sine wave has less abrupt vertical transitions which in turn means that abrupt changes in power over relatively short periods of time are avoided. In addition, by smoothing the beginning and end portions of the waveform with a raised sine function, the aforementioned undesired frequency content is at least reduced.

The duration of this in-phase signal component can vary with the needs of the particular application setting. By one approach, a duration of about 500 microseconds has been found to serve well.

This process 400 then also provides 402 a quadrature signal component having a non-zero portion. This, of course, varies considerably from typical prior art practice in this regard. By one approach, this non-zero portion does not need to extend for the entire duration of the in-phase signal component. Instead, if desired, this non-zero portion can comprise a relatively small portion of the entire quadrature signal component. These teachings encourage, however, providing for temporal coincidence between this non-zero portion of the quadrature signal component and the zero-crossing portion of the in-phase signal component.

Figure 6:
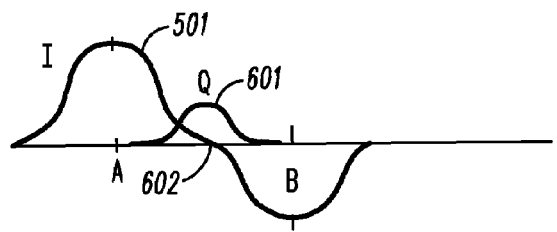
FIG. 6 comprises a signal diagram as configured in accordance with various embodiments.

FIG. 6 presents an illustrative example of such a quadrature signal component. In this illustrative example, it can be seen that the non-zero portion 601 of the quadrature signal component includes and extends to either side of the zero-crossing 602 of the in-phase signal component 501. At the same time, however, it can also be seen that the non-zero portion 601 of the quadrature signal component comprises a minor portion of the overall signal component. Moreover, it can be observed that, if desired, the quadrature signal component can have at least one zero amplitude portion that coincides temporally with a maximum amplitude of the in-phase signal.

In the example shown, it will also be observed and appreciated that the peak amplitude of the non-zero portion 601 of the quadrature signal component is less than the peak amplitude of the in-phase signal component. This difference in peak amplitude, of course, corresponds to a reduction in the amount of power employed. These approaches, in turn, reduce the opportunity for, and/or the amount of, adjacent channel splatter.

Figure 7:
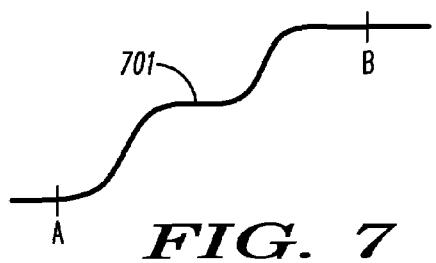
FIG. 7 comprises a phase diagram as configured in accordance with various embodiments.
Figure 8:
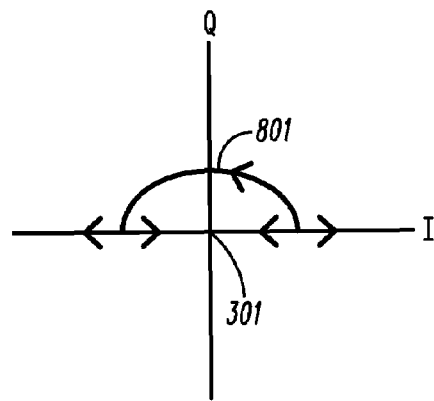
FIG. 8 comprises a constellation diagram as configured in accordance with various embodiments.

Referring again to FIG. 4, this process 400 then provides for combining 403 the in-phase signal component and the quadrature signal component to thereby provide a resultant Cartesian training waveform. With reference to FIG. 7, this resultant Cartesian training waveform exhibits a considerably more gradual change in phase 701 than that which occurs with the above-described prior art approach. In addition, and referring now to FIG. 8, a corresponding view of the constellation behavior of this approach reveals that the signal pathway 801 now avoids passing through the origin 301 due to the influence of the non-zero quadrature signal component.

Those skilled in the art will recognize and appreciate that such a Cartesian training waveform can substantially if not wholly avoid the prior art issues of adjacent channel splatter that can arise when using an in-phase signal component-only basis for the Cartesian training waveform. This, in turn, can permit such an overall approach to linearization to remain viable even as performance specifications become narrower and more constrained.

Figure 9:
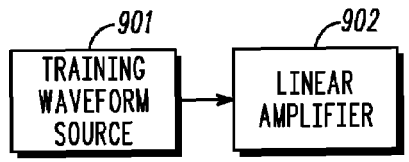
FIG. 9 comprises a block diagram as configured in accordance with various embodiments.

Those skilled in the art will appreciate that the above-described processes are readily enabled using any of a wide variety of available and/or readily configured platforms, including partially or wholly programmable platforms as are known in the art or dedicated purpose platforms as may be desired for some applications. Referring now to FIG. 9, an illustrative approach to such a platform will now be provided. In this illustrative example, a corresponding apparatus 900 can comprise a training waveform source 901 having an output that provides the above-described Cartesian training waveform, as needed, to an operatively coupled input of a corresponding linear amplifier 902. The latter can comprise, of course, a linear amplifier that uses Cartesian feedback linearization. Various approaches are known in the art in this regard. As these teachings are not overly sensitive to any particular selection in this regard, for the sake of brevity and the preservation of clarity, further elaboration in this regard will not be presented here.

The training waveform source 901 itself can comprise a corresponding platform of choice. This can include, if desired, use of a partially or fully programmable platform such as a microprocessor, a microcontroller, a digital signal processor, or the like. Generally speaking, such a platform is configured and arranged (via, for example, corresponding programming as will be well understood by those skilled in the art) to effect one or more of the steps and/or actions as are set forth herein.

Figure 10:
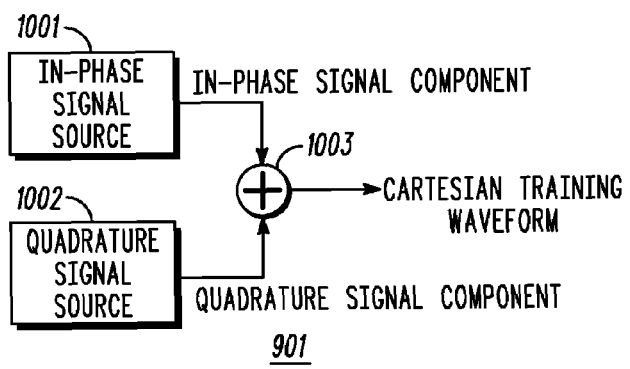
FIG. 10 comprises a block diagram as configured in accordance with various embodiments.

With reference to FIG. 10, this can comprise, for example, having the training waveform source 901 comprise an in-phase signal source 1001 capable of providing the described in-phase signal component, a quadrature signal source 1002 capable of providing the described quadrature signal component, and a summer 1003 for receiving and suitably combining the in-phase and quadrature signal components to yield the resultant described Cartesian training waveform. Again, such components can be provided through use of dedicated-purpose components and/or programmable components as desired.

Those skilled in the art will recognize and understand that such an apparatus 901 may be comprised of a plurality of physically distinct elements as is suggested by the illustration shown in FIG. 10. It is also possible, however, to view this illustration as comprising a logical view, in which case one or more of these elements can be enabled and realized via a shared platform. It will also be understood that such a shared platform may comprise a wholly or at least partially programmable platform as are known in the art.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method of providing a Cartesian training waveform for use when training a linear amplifier that uses Cartesian feedback linearization, comprising:
   providing an in-phase signal component having a zero-crossing portion;
   providing a quadrature signal component having a non-zero portion;
   combining the in-phase signal component and the quadrature signal component such that the zero-crossing portion of the in-phase signal component is coincident in time with the non-zero portion of the quadrature signal component to provide a Cartesian training waveform exhibiting a gradual change in phase.

2. The method of claim 1 wherein the non-zero portion of the quadrature signal component has an amplitude that is less than a peak amplitude of the in-phase signal component.

3. The method of claim 2 wherein the non-zero portion of the quadrature signal component amplitude is minimized.

4. The method of claim 1 wherein the quadrature signal component also has at least one zero amplitude portion, wherein the at least one zero amplitude portion coincides temporally with a maximum amplitude of the in-phase signal.

5. The method of claim 1 wherein the in-phase component comprises, at least in substantial part, a sine wave.

6. The method of claim 5 wherein the sine wave comprises a smoothed sine wave.

7. The method of claim 6 wherein the smoothed sine wave comprises a raised-sine function.

8. An apparatus comprising:
   a linear amplifier that uses Cartesian feedback linearization and that comprises, in part, a Cartesian training waveform input;
   a training waveform source having an output operably coupled to the Cartesian training waveform input and being configured and arranged to:
   provide an in-phase signal component having a zero-crossing portion;
   provide a quadrature signal component having a non-zero portion;
   combine the in-phase signal component and the quadrature signal component such that the zero-crossing portion of the in-phase signal component is coincident in time with the non-zero portion of the quadrature signal component to provide a Cartesian training waveform to the output exhibiting a gradual change in phase.

9. The apparatus of claim 8 wherein the non-zero portion of the quadrature signal component has an amplitude that is less than a peak amplitude of the in-phase signal component.

10. The apparatus of claim 8 wherein the non-zero portion of the quadrature signal component amplitude is minimized.

11. The apparatus of claim 8 wherein the in-phase signal component lacks any abrupt power changes over time.

12. The apparatus of 8 wherein the in-phase component comprises, at least in substantial part, a sine wave.

13. The apparatus of claim 12 wherein the sine wave comprises a smoothed sine wave.

14. The apparatus of claim 13 wherein the smoothed sine wave comprises a raised-sine function.

15. The apparatus of claim 8 wherein the training waveform source comprises:
   means for providing an in-phase signal component;
   means for providing a quadrature signal component having a non-zero portion;
   means for combining the in-phase signal component and the quadrature signal component to provide the Cartesian training waveform.

* * * * *